US012761273B2

(12) United States Patent
Yang et al.

(10) Patent No.: US 12,761,273 B2
(45) Date of Patent: Oct. 13, 2026

(54) OUTLIER INTEGRATED CIRCUIT DETECTION METHOD AND OUTLIER INTEGRATED CIRCUIT DETECTION SYSTEM BY USING MACHINE LEARNING FRAMEWORKS

(71) Applicant: MEDIATEK INC., Hsin-Chu (TW)

(72) Inventors: Yu-Lin Yang, Hsinchu City (TW); Chin-Wei Lin, Hsinchu City (TW); Po-Chao Tsao, Hsinchu City (TW); Tung-Hsing Lee, Hsinchu City (TW); Chia-Jung Ni, Hsinchu City (TW); Chi-Ming Lee, Hsinchu City (TW); Yi-Ju Ting, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 445 days.

(21) Appl. No.: 18/376,447

(22) Filed: Oct. 4, 2023

(65) Prior Publication Data

US 2024/0133949 A1 Apr. 25, 2024
US 2024/0230755 A9 Jul. 11, 2024

Related U.S. Application Data

(60) Provisional application No. 63/380,248, filed on Oct. 20, 2022.

(51) Int. Cl.
*G01R 31/28* (2006.01)
*G06N 20/00* (2019.01)

(52) U.S. Cl.
CPC ......... *G01R 31/2894* (2013.01); *G06N 20/00* (2019.01)

(58) Field of Classification Search
CPC .......... G06N 20/20; G06N 5/01; G06N 20/00; G01R 31/2894
See application file for complete search history.

(56) References Cited

U.S. PATENT DOCUMENTS

| | | | | |
|---|---|---|---|---|
| 10,795,346 | B2 * | 10/2020 | Yennie | B24B 37/013 |
| 11,410,290 | B2 * | 8/2022 | Ophir | G03F 7/70633 |
| 11,762,013 | B2 * | 9/2023 | Landman | G01R 31/2803 714/724 |
| 2007/0129836 | A1 | 6/2007 | Hendler | |
| 2012/0239178 | A1 | 9/2012 | Wu | |
| 2018/0202942 | A1 | 7/2018 | Kang | |
| 2022/0246457 | A1 | 8/2022 | Sundar | |

FOREIGN PATENT DOCUMENTS

| | | | |
|---|---|---|---|
| TW | 201945923 | A | 12/2019 |
| TW | 202115390 | A | 4/2021 |
| TW | 202115414 | A | 4/2021 |

* cited by examiner

*Primary Examiner* — An H Do
(74) *Attorney, Agent, or Firm* — Winston Hsu

(57) ABSTRACT

An outlier IC detection method includes acquiring first measured data of a first IC set, training the first measured data for establishing a training model, acquiring second measured data of a second IC set, generating predicted data of the second IC set by using the training model according to the second measured data, generating a bivariate dataset distribution of the second IC set according to the predicted data and the second measured data, acquiring a predetermined Mahalanobis distance on the bivariate dataset distribution of the second IC set, and identifying at least one outlier IC from the second IC set when at least one position of the at least one outlier IC on the bivariate dataset distribution is outside a range of the predetermined Mahalanobis distance.

18 Claims, 4 Drawing Sheets

OUTLIER INTEGRATED CIRCUIT DETECTION METHOD AND OUTLIER INTEGRATED CIRCUIT DETECTION SYSTEM BY USING MACHINE LEARNING FRAMEWORKS

CROSS REFERENCE TO RELATED APPLICATIONS

This application claims the benefit of U.S. Provisional Application No. 63/380,248, filed on Oct. 20, 2022. The content of the application is incorporated herein by reference.

BACKGROUND

With the rapid advancement of technologies, various integrated circuits (ICs) are popularly adopted in our daily life. Therefore, high quality and low operational risk ICs are required for various electronic applications. In a post silicon test flow, to provide high quality and low operational risk ICs, outlier ICs are identified and labeled by analyzing measured testing values.

However, in a conventional outlier IC identification method, although some outlier ICs can be identified according to their measured testing values, no prediction function of identifying potential outlier ICs is introduced. Therefore, some failed ICs cannot be captured, leading to degradation of testing efficiency.

Therefore, to develop an outlier IC detection method capable of identifying and predicting outlier ICs accurately is an important issue.

SUMMARY

In an embodiment of the present invention, an outlier integrated circuit (IC) detection method is disclosed. The outlier IC detection method comprises acquiring first measured data of a first IC set, training the first measured data for establishing a training model, acquiring second measured data of a second IC set, generating predicted data of the second IC set by using the training model according to the second measured data, generating a bivariate dataset distribution of the second IC set according to the predicted data and the second measured data, acquiring a predetermined Mahalanobis distance on the bivariate dataset distribution of the second IC set, and identifying at least one outlier IC from the second IC set when at least one position of the at least one outlier IC on the bivariate dataset distribution is outside a range of the predetermined Mahalanobis distance. The first IC set and the second IC set are different. The at least one outlier IC is withdrawn from the second IC set.

In another embodiment of the present invention, an outlier integrated circuit (IC) detection system is disclosed. The outlier IC detection system comprises a training stage unit configured to receive first measured data of a first IC set, an inference stage unit configured to receive second measured data of a second IC set, an extreme gradient boosting (XGBoost) unit coupled to the training stage unit, a memory coupled to the XGBoost unit and the inference stage unit, a Mahalanobis distance unit coupled to the memory, and an outlier IC identification unit coupled to the Mahalanobis distance unit. The first measured data is trained by using the training stage unit. The trained first measured data is used for generating a training model by the XGBoost unit. The training model is saved in the memory. The second measured data received by the inference stage unit is inputted to the memory. Predicted data of the second IC set is generated by using the training model according to the second measured data. A bivariate dataset distribution of the second IC set is generated according to the predicted data and the second measured data. A predetermined Mahalanobis distance on the bivariate dataset distribution of the second IC set is generated by the Mahalanobis distance unit for identifying outlier IC. At least one outlier IC is identified from the second IC set by the outlier IC identification unit when at least one position of at least one outlier IC on the bivariate dataset distribution is outside a range of the predetermined Mahalanobis distance. The first IC set and the second IC set are different. The at least one outlier IC is withdrawn from the second IC set.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
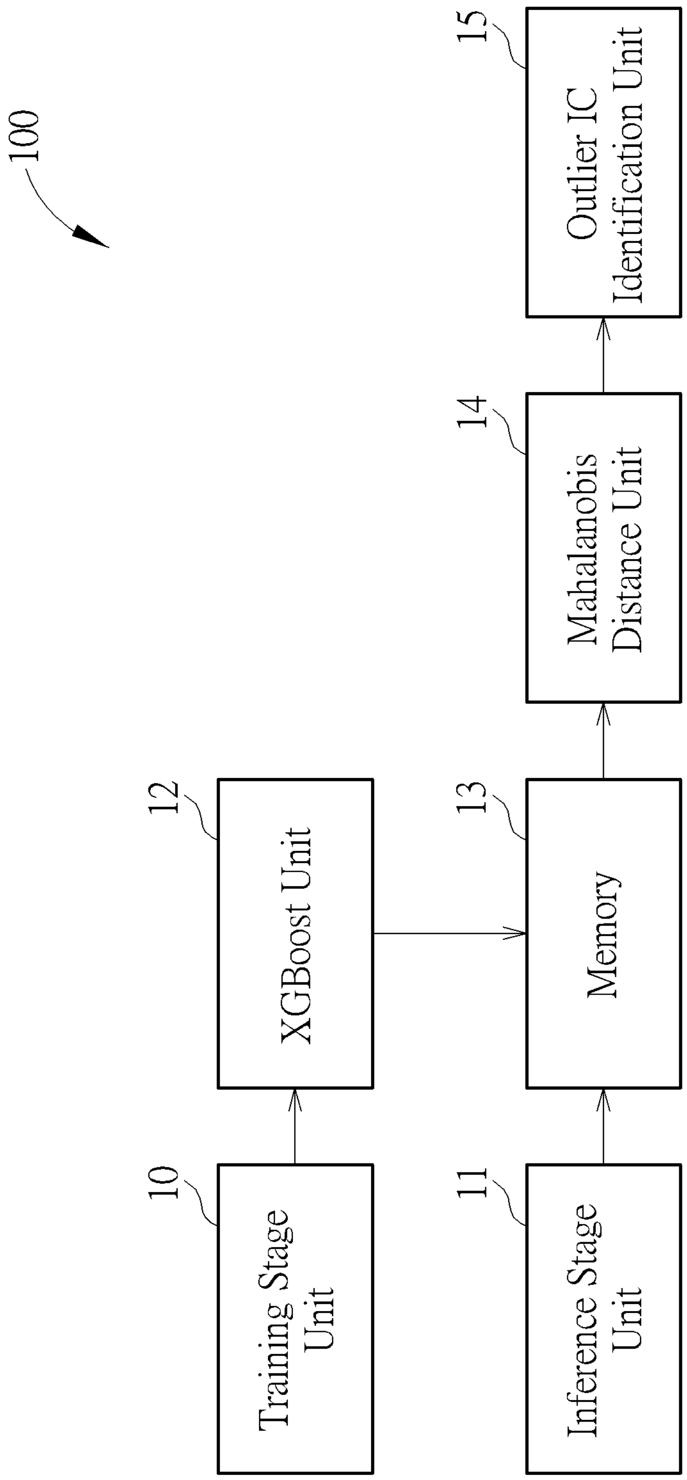
FIG. 1 is a block diagram of an outlier integrated circuit detection system according to an embodiment of the present invention.

FIG. 1 is a block diagram of an outlier integrated circuit (IC) detection system 100 according to an embodiment of the present invention. The outlier IC detection system 100 can be used for identifying and predicting at least one outlier IC in a post silicon test flow to improve IC quality testing efficiency. However, applications of the outlier IC detection system 100 are not limited thereto. The outlier IC detection system 100 includes a training stage unit 10, an inference stage unit 11, an extreme gradient boosting (XGBoost) unit 12, a memory 13, a Mahalanobis distance unit 14, and an outlier IC identification unit 15. The training stage unit 10 is used for receiving first measured data of a first IC set. The inference stage unit 11 is used for receiving second measured data of a second IC set. Here, the first IC set and the second IC set are different. For example, the first IC set can be manufactured previously. The second IC set can be manufactured after the first IC set is manufactured. The XGBoost unit 12 may be coupled to the training stage unit 10. The memory 13 may be coupled to the XGBoost unit 12 and the inference stage unit 11. The Mahalanobis distance unit 14 may be coupled to the memory 13. The outlier IC identification unit 15 may be coupled to the Mahalanobis distance unit 14. In the outlier IC detection system 100, the first measured data is trained by using the training stage unit 10. Then, the trained first measured data is used for generating a training model by the XGBoost unit. Here, the XGBoost unit 12 can use machine learning frameworks for establishing the training model according to the first measured data. The training model is saved in the memory 13. The second measured data received by the inference stage unit 11 is inputted to the memory 13. Predicted data of the second IC set can be generated by using the training model according to the second measured data. In other words, in the outlier IC detection system 100, the predicted data can be generated by using the machine learning frameworks according to the first measured data processed by the training stage unit 10 and the second measured data processed by the inference stage unit 11. Then, a bivariate dataset distribution of the second IC set can be generated according to the predicted data and the second measured data. A predetermined Mahalanobis distance on the bivariate dataset distribution of the second IC set can be generated (or say, preconfigured) by the Mahalanobis distance unit 14 for identifying outlier ICs. Since the Mahalanobis distance is predetermined, at least one outlier IC can be identified from the second IC set by the outlier IC identification unit 15 when at least one position of at least one outlier IC on the bivariate dataset distribution is outside a range of the predetermined Mahalanobis distance. After the at least one outlier IC is identified, the at least one outlier IC is withdrawn from the second IC set. In the outlier IC detection system 100, the training stage unit 10, the inference stage unit 11, the XGBoost unit 12, the Mahalanobis distance unit 14, and the outlier IC identification unit 15 can be software programs or hardware modules. Any reasonable technology or hardware modification falls into the scope of the present invention.

In the outlier IC detection system 100, the outlier IC identification technology can be applied to a post silicon test flow. For example, the second measured data of the second IC (i.e., data processed by the inference stage unit 11) can include wafer sort (WS) process measured data and final test (FT) process measured data. The WS process is a wafer-level chip probe (CP) process in the post silicon test flow. The FT process is a die-level test process in the post silicon test flow. In the outlier IC detection system 100, the at least one outlier IC identified from the second IC set according to the predetermined Mahalanobis distance can include at least one outlier IC of the WS process or the FT process in the post silicon test flow. In other words, when the potential outlier ICs are predicted or identified by using measured data information of the WS process and FT process, the testing efficiency is improved. Details of identifying and predicting at least one outlier IC by using Mahalanobis distance are illustrated below.

Figure 2:
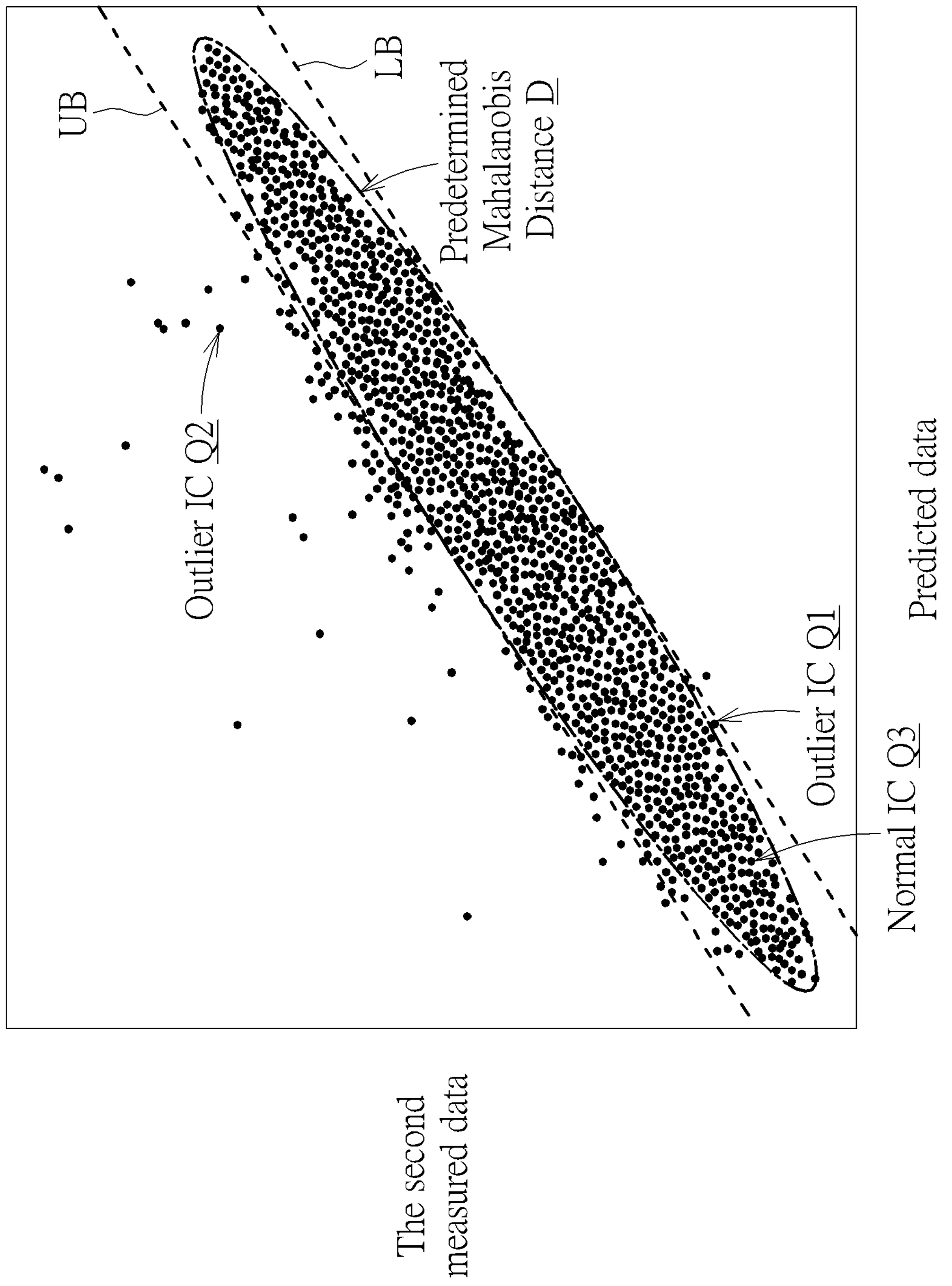
FIG. 2 is an illustration of a bivariate dataset distribution of the second IC set and a predetermined Mahalanobis distance of the outlier integrated circuit detection system in FIG. 1.

FIG. 2 is an illustration of a bivariate dataset distribution of the second IC set and the predetermined Mahalanobis distance D of the outlier integrated circuit detection system 100. As previously mentioned, the predicted data can be generated by using the machine learning frameworks according to the first measured data processed by the training stage unit 10 and the second measured data processed by the inference stage unit 11. Therefore, the predicted data can be regarded as measured data for "ideal ICs". Particularly, the predicted data and the second measured data have the same testing term (i.e., or say, the same testing parameter). In FIG. 2, two axes of the bivariate dataset distribution of the second IC set include a first axis (i.e., X-axis) indicating the predicted data and a second axis (i.e., Y-axis) indicating the second measured data. Since the predicted data can be regarded as measured data for "ideal ICs", when a correlation between the predicted data and the second measured data increases, it implies that the second IC set approaches an ideal IC set. Therefore, correlation coefficients of the second IC set on the bivariate dataset distribution increase. Conversely, when a correlation between the predicted data and the second measured data decreases, it implies that distributions of the second IC set are diverged. Therefore, correlation coefficients of the second IC set on the bivariate dataset distribution decrease. In the outlier IC detection system 100, a Mahalanobis distance is introduced for identifying at least one outlier IC. The Mahalanobis distance can be predetermined according to yield loss configurations of the second IC set. Here, the Mahalanobis distance in FIG. 2 is called as the predetermined Mahalanobis distance D. The predetermined Mahalanobis distance D corresponds to a closed curve on the bivariate dataset distribution. In FIG. 2, at least one outlier IC is identified from the second IC set by the outlier IC identification unit 15 when at least one position of at least one outlier IC on the bivariate dataset distribution is outside a range of the predetermined Mahalanobis distance D. For example, Outlier IC Q1 and Outlier IC Q2 can be identified by the outlier IC identification unit 15. Normal IC Q3 can be identified since a position of the normal IC Q3 is inside the range of the predetermined Mahalanobis distance D.

In FIG. 2, the predetermined Mahalanobis distance D can be written as:

$$D=\sqrt{(x-mx)^T S^{-1}(x-mx)}$$

Here, x is denoted as a sample vector of the second IC set. mx is denoted as a mean vector of the second IC set. S is a covariance matrix of a sample space. Specifically, since the predetermined Mahalanobis distance D can be regarded as a covariance-based threshold, the outlier IC detection system 100 using the Mahalanobis distance D can improve the quality of testing efficiency. For example, when the outlier IC detection system 100 uses a residual approach algorithm including an upper bound threshold UB and a lower bound threshold for identifying outlier ICs, some potential outlier ICs cannot be identified. For example, the outlier IC Q1 can be identified according to the predetermined Mahalanobis distance D. However, the outlier IC Q1 cannot be identified according to the upper bound threshold UB and the low bound threshold of the residual approach algorithm. Therefore, since the covariance information of the sample space (i.e., the second IC set) is introduced to the predetermined Mahalanobis distance D, the outlier IC detection system 100 can accurately identify and predict outlier ICs.

Figure 3:
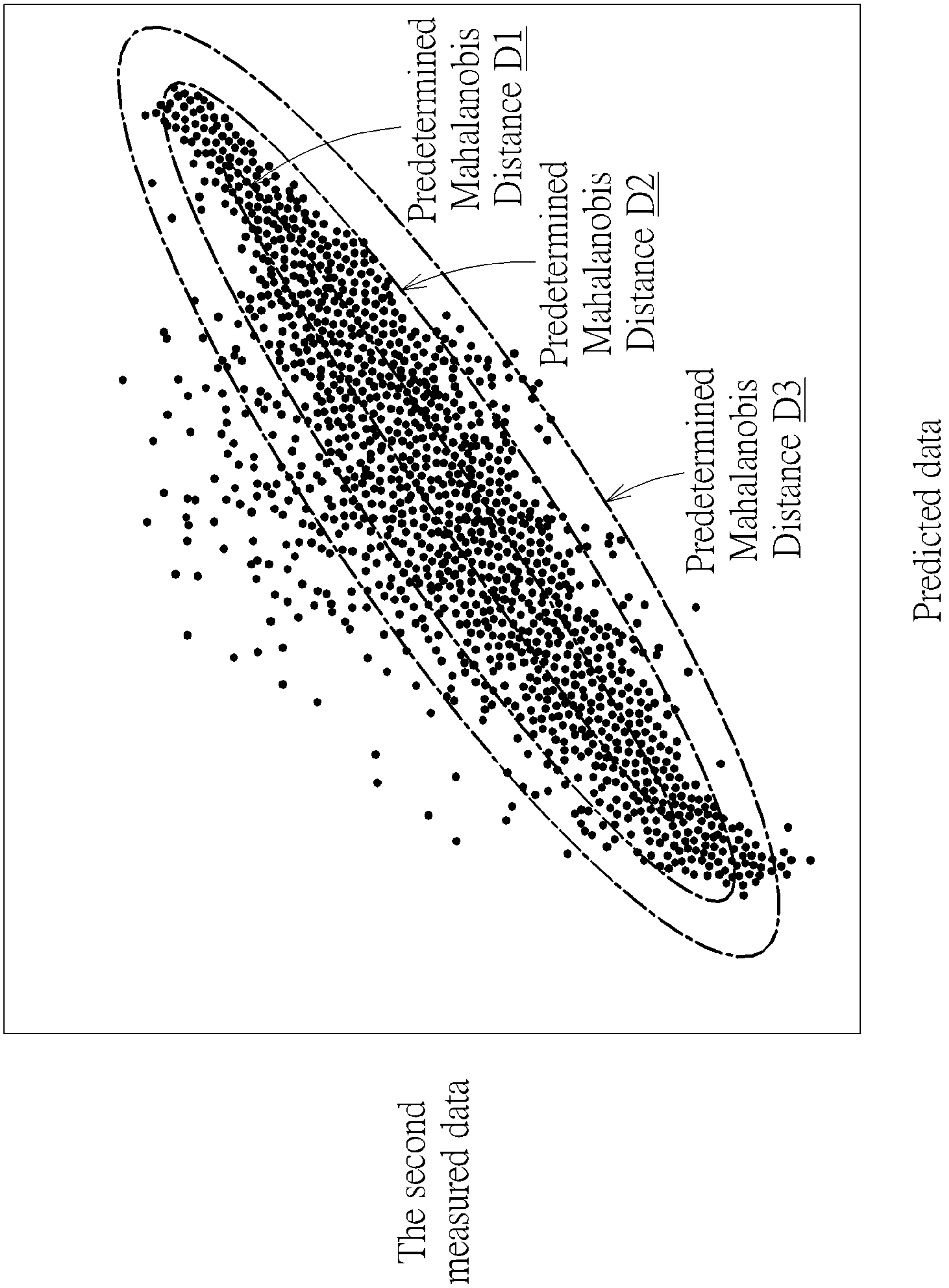
FIG. 3 is an illustration of the bivariate dataset distribution of the second IC set and different predetermined Mahalanobis distances of the outlier integrated circuit detection system in FIG. 1.

FIG. 3 is an illustration of the bivariate dataset distribution of the second IC set and different predetermined Mahalanobis distances of the outlier integrated circuit detection system 100. As previously mentioned, the Mahalanobis distance can be predetermined according to requirements of the second IC set. As a result, the predetermined Mahalanobis distance can be adjusted for various IC applications. In FIG. 3, a predetermined Mahalanobis distance D1 can be set as 15. A predetermined Mahalanobis distance D2 can be set as 25. A predetermined Mahalanobis distance D3 can be set as 50. Here, when the predetermined Mahalanobis distance decreases, the number of outlier ICs identified from the second IC set increases. When the predetermined Mahalanobis distance increases, the number of outlier ICs identified from the second IC set decreases. For example, when the ICs are applied to automotive products, temperature sensitivity is an important issue. If the temperature sensitivity is a testing term of the second measured data, the predetermined Mahalanobis distance can be decreased for strictly identifying outlier ICs. Any reasonable predetermined Mahalanobis distance adjustment technology falls into the scope of the present invention.

In the outlier IC detection system 100, the ICs have a plurality of measured terms. After the measured terms of the ICs are acquired, parameters of the measured terms can be adjusted according to a failed IC capture rate and yield loss configurations. For example, different allocations of the measured terms can be generated for identifying outlier ICs according to the failed IC capture rate and yield loss configurations. After the parameters of the measured terms are adjusted, the first measured data and the second measured data indicate testing result information of at least one allocated measured term of the ICs. However, the outlier IC detection system 100 is not limited thereto. For example, in other embodiments, any reasonable combination of the measured terms can be processed by the outlier IC detection system 100.

Figure 4:
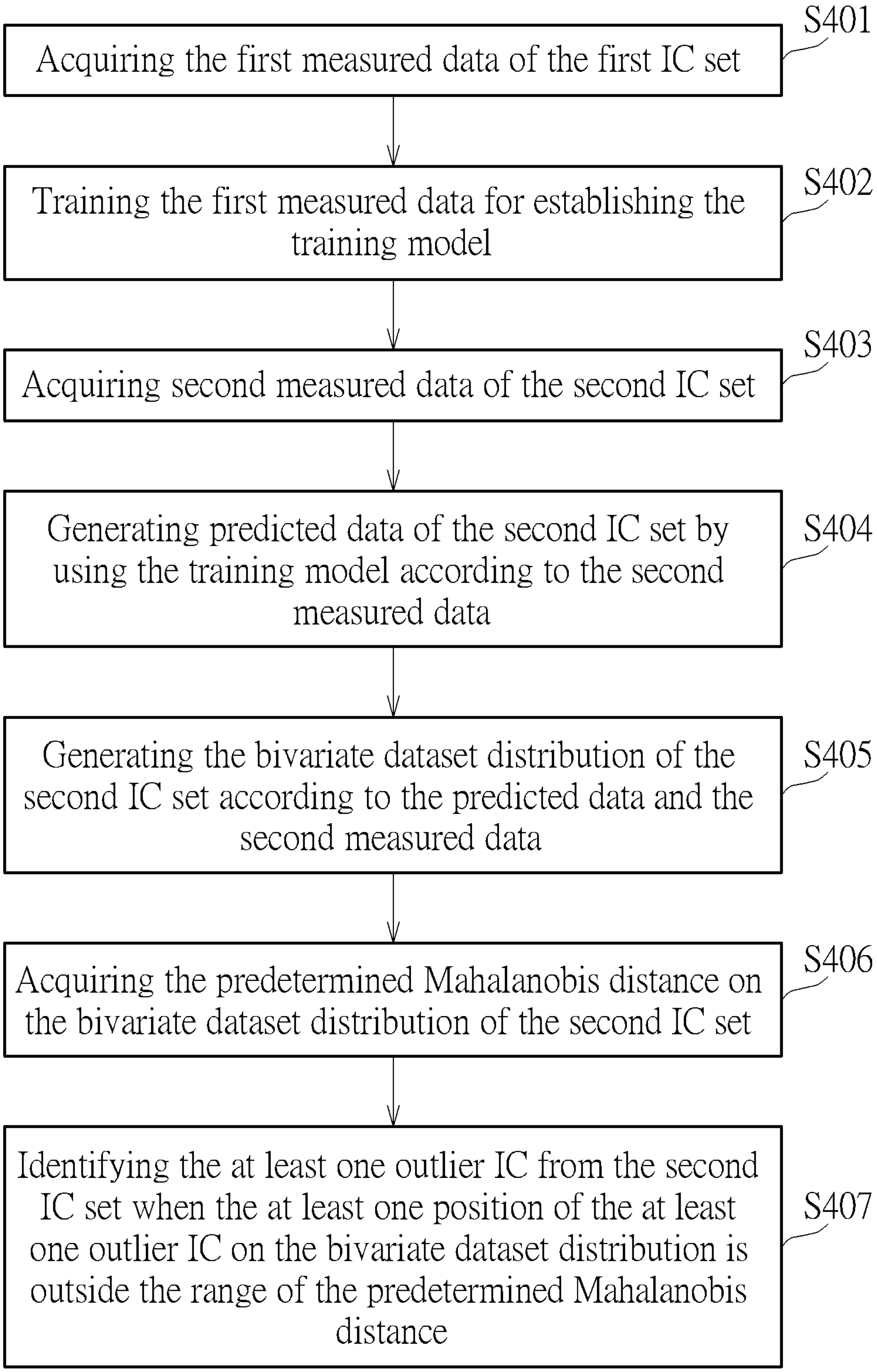
FIG. 4 is a flow chart of an outlier integrated circuit detection method performed by the outlier integrated circuit detection system in FIG. 1

FIG. 4 is a flow chart of an outlier integrated circuit detection method performed by the outlier integrated circuit detection system 100. The outlier IC detection method includes step S401 to step S407. Any reasonable technology modification falls into the scope of the present invention. Step S401 to step S407 are illustrated below.

step S401: acquiring the first measured data of the first IC set;

step S402: training the first measured data for establishing the training model;

step S403: acquiring second measured data of the second IC set;

step S404: generating predicted data of the second IC set by using the training model according to the second measured data;

step S405: generating the bivariate dataset distribution of the second IC set according to the predicted data and the second measured data;

step S406: acquiring the predetermined Mahalanobis distance on the bivariate dataset distribution of the second IC set;

step S407: identifying the at least one outlier IC from the second IC set when the at least one position of the at least one outlier IC on the bivariate dataset distribution is outside the range of the predetermined Mahalanobis distance.

Step S401 to step S407 are previously illustrated. Thus, details are omitted here. In the outlier IC detection system 100, since the machine learning frameworks are introduced for generating the predicted data, the Mahalanobis distance can be used for identifying at least one outlier IC according to correlations of the predicted data and the second measured data having the same testing term.

To sum up, the present invention discloses an outlier IC detection method and an outlier IC detection system. The outlier IC detection system can be used for identifying and predicting at least one outlier IC by using the Mahalanobis distance. The machine learning frameworks are introduced for generating the predicted data. The predicted data can be regarded as measured data for ideal ICs. By using the bivariate dataset distribution of the second IC set generated according to the predicted data and the second measured data, since the covariance information of the sample space (i.e., the second IC set) is introduced to the predetermined Mahalanobis distance D, the outlier IC detection system can accurately identify and predict outlier ICs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An outlier integrated circuit (IC) detection method performed in a post silicon test flow, comprising:

acquiring first measured data of a first IC set;

training the first measured data for establishing a training model;

acquiring second measured data of a second IC set, wherein the second measured data comprises wafer sort (WS) process measured data and/or final test (FT) process measured data;

generating predicted data of the second IC set by using the training model according to the second measured data;

generating a bivariate dataset distribution of the second IC set according to the predicted data and the second measured data;

acquiring a predetermined Mahalanobis distance on the bivariate dataset distribution of the second IC set, wherein the predetermined Mahalanobis distance is generated according to yield loss configurations of the second IC set; and identifying at least one outlier IC from the second IC set when at least one position of the at least one outlier IC on the bivariate dataset distribution is outside a range of the predetermined Mahalanobis distance;

wherein the first IC set and the second IC set are different, and the at least one outlier IC is withdrawn from the second IC set.

2. The method of claim 1, wherein when the predetermined Mahalanobis distance decreases, an amount of the at least one outlier IC identified from the second IC set increases.

3. The method of claim 1, wherein when the predetermined Mahalanobis distance increases, an amount of the at least one outlier IC identified from the second IC set decreases.

4. The method of claim 1, wherein two axes of the bivariate dataset distribution of the second IC set comprise a first axis indicating the predicted data and a second axis indicating the second measured data, and when a correlation between the predicted data and the second measured data increases, correlation coefficients of the second IC set on the bivariate dataset distribution increase.

5. The method of claim 1, wherein the second measured data of the second IC set comprises wafer sort (WS) process measured data and final test (FT) process measured data.

6. The method of claim 5, wherein the at least one outlier IC identified from the second IC set according to the predetermined Mahalanobis distance comprises at least one outlier IC of the WS process or the FT process in a post silicon test flow.

7. The method of claim 1, wherein training the first measured data for establishing the training model, is training the first measured data by using an extreme gradient boosting (XGBoost) unit for establishing the training model.

8. The method of claim 1, further comprising:

acquiring a plurality of measured terms of the first IC set and the second IC set;

adjusting parameters of the measured terms according to failed IC capture rate configurations and yield loss configurations; and generating the first measured data of the first IC set and the second measured data of the second IC set after the parameters of the measured terms are adjusted.

9. The method of claim 1, wherein the predicted data is generated by using machine learning frameworks according to the first measured data processed by a training stage unit and the second measured data processed by an inference stage unit.

10. An outlier integrated circuit (IC) detection system for use in a post silicon test flow, comprising:

a training stage unit configured to receive first measured data of a first IC set;

an inference stage unit configured to receive second measured data of a second IC set, wherein the second measured data comprises wafer sort (WS) process measured data and/or final test (FT) process measured data;

an extreme gradient boosting (XGBoost) unit;

a memory;

a Mahalanobis distance unit; and an outlier IC identification unit;

wherein the first measured data is trained by using the training stage unit, the trained first measured data is used for generating a training model by the XGBoost unit, the training model is saved in the memory, the second measured data received by the inference stage unit is inputted to the memory, predicted data of the second IC set is generated by using the training model according to the second measured data, a bivariate dataset distribution of the second IC set is generated according to the predicted data and the second measured data, a predetermined Mahalanobis distance on the bivariate dataset distribution of the second IC set is generated by the Mahalanobis distance unit according to yield loss configurations of the second IC set for identifying at least one outlier IC, and at least one outlier IC is identified from the second IC set by the outlier IC identification unit when at least one position of at least one outlier IC on the bivariate dataset distribution is outside a range of the predetermined Mahalanobis distance, the first IC set and the second IC set are different, and the at least one outlier IC is withdrawn from the second IC set.

11. The system of claim 10, wherein when the predetermined Mahalanobis distance decreases, an amount of the at least one outlier IC identified from the second IC set increases.

12. The system of claim 10, wherein when the predetermined Mahalanobis distance increases, an amount of the at least one outlier IC identified from the second IC set decreases.

13. The system of claim 10, wherein two axes of the bivariate dataset distribution of the second IC set comprise a first axis indicating predicted data and a second axis indicating second measured data, and when a correlation between the predicted data and the second measured data increases, correlation coefficients of the second IC set on the bivariate dataset distribution increase.

14. The system of claim 10, wherein the second measured data of the second IC set comprises wafer sort (WS) process measured data and final test (FT) process measured data.

15. The system of claim 14, wherein the at least one outlier IC identified from the second IC set according to the predetermined Mahalanobis distance comprises at least one outlier IC of the WS process or the FT process in a post silicon test flow.

16. The system of claim 10, wherein the XGBoost unit uses machine learning frameworks for establishing the training model according to the first measured data.

17. The system of claim 10, wherein a plurality of measured terms of the first IC set are acquired, parameters of the measured terms are adjusted according to failed IC capture rate configurations and yield loss configurations, and after the parameters of the measured terms are adjusted, the first measured data of the first IC set and the second measured data of the second IC set are generated.

18. The system of claim 10, wherein the predicted data is generated by using machine learning frameworks according to the first measured data processed by a training stage unit and the second measured data processed by an inference stage unit.

* * * * *